(12) United States Patent
Bhattacharya et al.

(10) Patent No.: US 7,225,423 B2
(45) Date of Patent: May 29, 2007

(54) METHOD FOR AUTOMATED DESIGN OF INTEGRATED CIRCUITS WITH TARGETED QUALITY OBJECTIVES USING DYNAMICALLY GENERATED BUILDING BLOCKS

(75) Inventors: Debashis Bhattacharya, Plano, TX (US); Vamsi Boppana, Santa Clara, CA (US); Rabindra Roy, Hillsboro, OR (US); Jayanta Roy, San Jose, CA (US)

(73) Assignee: Zenasis Technologies, Inc., San Jose, CA (US)

( * ) Notice: Subject to any disclaimer, the term of this patent is extended or adjusted under 35 U.S.C. 154(b) by 0 days.

(21) Appl. No.: 09/896,059

(22) Filed: Jun. 29, 2001

(65) Prior Publication Data

US 2002/0069396 A1 Jun. 6, 2002

Related U.S. Application Data

(60) Provisional application No. 60/215,524, filed on Jun. 30, 2000.

(51) Int. Cl.
G06F 17/50 (2006.01)

(52) U.S. Cl. .......................... 716/18; 716/7
(58) Field of Classification Search ................ 716/18, 716/4, 3, 2, 1
See application file for complete search history.

(56) References Cited

U.S. PATENT DOCUMENTS

| | | | | |
|---|---|---|---|---|
| 5,706,205 A * | 1/1998 | Masuda et al. | ................ | 716/18 |
| 5,712,793 A * | 1/1998 | Scepanovic et al. | .......... | 716/12 |
| 5,796,128 A | 8/1998 | Tran et al. | ................... | 257/202 |
| 5,805,860 A * | 9/1998 | Parham | ........................ | 716/12 |
| 5,898,595 A * | 4/1999 | Bair et al. | ...................... | 716/2 |
| 5,923,569 A * | 7/1999 | Kumashiro et al. | ............ | 716/7 |
| 6,051,031 A * | 4/2000 | Shubat et al. | ................... | 716/3 |
| 6,184,718 B1 | 2/2001 | Tran et al. | ................... | 326/121 |
| 6,249,902 B1 * | 6/2001 | Igusa et al. | ................... | 716/10 |
| 6,301,692 B1 * | 10/2001 | Kumashiro et al. | ........... | 716/10 |
| 6,308,309 B1 * | 10/2001 | Gan et al. | ....................... | 716/8 |
| 6,311,316 B1 * | 10/2001 | Huggins et al. | ............... | 716/12 |
| 6,493,863 B1 * | 12/2002 | Hamada et al. | ................ | 716/18 |
| 6,496,972 B1 * | 12/2002 | Segal | .......................... | 716/18 |
| 6,536,028 B1 * | 3/2003 | Katsioulas et al. | ........... | 716/17 |

(Continued)

OTHER PUBLICATIONS

Premal Buch et al., Logic Synthesis for Large Pass Transistor Circuits, IEEE/ACM International Conference on Computer-Aided Design, pp. 663-670, Nov. 1997.*

(Continued)

*Primary Examiner*—Leigh M. Garbowski
(74) *Attorney, Agent, or Firm*—Ohlandt, Greeley, Ruggiero & Perle L.L.P.

(57) ABSTRACT

A system and method for designing ICs, including the steps of: analyzing and optimizing a target IC design based on design-specific objectives; partitioning the optimized target IC design into pre-defined standard-cells from one or more libraries and creating design-specific cells specifically having unique functionality and characteristics not found amongst the standard-cells; identifying and determining a minimal subset of the standard-cells and design-specific cells, the interconnection of which represents the target IC design; generating the necessary views, including layout and characterizing of the design-specific cells included in a unique, minimal subset, wherein the IC design is subject to objectives and constraints of the target IC.

72 Claims, 10 Drawing Sheets

U.S. PATENT DOCUMENTS 7,003,738 B2* 2/2006 Bhattacharya et al. ......... 716/1

OTHER PUBLICATIONS

R. Murgai et al., Sequential Synthesis for Table Look Up PGA's, Proceedings of Euro ASIC '92, pp. 32-37, Jun. 1992.*

E.M. Sentovich et al., SIS: A System for Sequential Circuit Synthesis, Electronics Research Library, University of California, Berkeley, 1992, pp. 1-45.*

J. P. Fishburn and A. E. Dunlop, AT&T Bell Laboratories, "*TILOS: A Posynomial Programming Approach to Transistor Sizing*", p. 326-328, IEEE, 1985.

George et al., "*Power Analysis and Characterization for Semi-Custom Design*", p. 215-218, IWLPD'94 Workshop Proceedings.

Ken Scott and Kurt Keutzer, "*Improving Cell Libraries for Synthesis*", IEEE 1994 Custom Integrated Circuits Conference.

Kanwar Jit Singh, "*Performance Optimization of Digital Circuits*", B. Tech (Indian Institute of Technology, Kanpur) 1986 and University of California at Berkeley 1992.

Randal Bryant, "*Symbolic Boolean Manipulation with Ordered Binary-Decision Diagrams*", ACM Computing Surveys, vol. 24, No. 3, pp. 293-318 (pp. 1-52), Sep. 1992.

D. G. Chinnery and K. Keutzer, "*Closing the Gap Between ASIC and Custom: An ASIC Perspective*", University of California at Berkley, 2000.

Olivier Coudert, Ramsey Haddad and Srilatha Manne, "*New Algorithms for Gate Sizing: A Comparative Study*", Design Automation conference, 1996.

William J. Dally, and Andrew Chang, "*The Role of custom Design in ASIC Chips*", Design Automotive Conference, 2000.

Cadabradesign.com, "*Library Creation Firms Pair-Up*", Press Release, 2000.

Chris Edwards, "*EDA Vendors Rethink Standard-Cell Libraries*", EEDesign, 2000.

Mahesh Ketkar, Kishore Kasamsetty, and Sachin Sapatnekar, "*Convex Delay Models for Transistor Sizing*", Electronics Times, 2000.

R. Panda et al., "*Migration: A New Technique to Improve Synthesized Designs Through Incremental Customization*", Proc. $35_{th}$ Design Automation Conference, 1998.

K. L. Shephard et al., "Design Methodology for the S/390 Parallel Enterprise Server G4 Microprocessor", IMM Journal of Research and Development, 1997.

Tanner EDA, "*Technology Files and Libraries: Digital Standard Cell Libraries*", Tanner.com, 2001.

\* cited by examiner

METHOD FOR AUTOMATED DESIGN OF INTEGRATED CIRCUITS WITH TARGETED QUALITY OBJECTIVES USING DYNAMICALLY GENERATED BUILDING BLOCKS

This application is related to U.S. Provisional Patent Application No. 60/215,524, filed on Jun. 30, 2000.

BACKGROUND OF THE INVENTION

1. Field of the Invention

The present invention relates generally to the design of integrated circuits (ICs) and, in particular, to a method of automated IC design based on the use of dynamically created building circuit blocks for achieving specific IC design objectives.

2. Description of the Related Art

Various automatic or semi-automatic design methods for integrated circuits (ICs) have been suggested and/or developed in an attempt to, for example, provide a cost-efficient IC design process. While such previous attempts at automating the IC design process have resulted in some success with respect to containing the cost of IC designs, the quality of the resultant IC designs are compromised as compared to the quality of full custom, handcrafted designs. Thus, despite previously proposed automated and/or semi automated IC design processes, there remains a need for an automated IC design process that can dynamically and efficiently yield IC designs that meet specific design objectives for a given IC design.

IC designs may generally be classified according to the type of circuit building blocks or cells used in the IC design process thereof. Broadly speaking, IC design processes can use either design-specific (i.e., custom) building blocks, or generic (i.e., standard) cells that are pre-defined. Standard cells are often provided as part of one or more libraries of such standard cells. A "custom" IC design process refers to the identification and implementation of the IC design by manual effort/human IC designers, often drawing on years of IC design experience. Often times, at least some of the critical portions of the IC design and the lower levels of design abstraction (e.g., the transistor-level design of blocks) are obtained using manual, custom design processes. The custom design process is labor-intensive, time consuming, and expensive. Custom design processes are prone to design "bugs" that result in long design cycle times. The custom IC design method, however, is typically capable of yielding high quality IC designs well-suited to the design objectives of the IC. This is due to the fact that the implemented IC design is specifically designed, from start to finish, using design-specific circuits and circuit building blocks designed for the subject IC, including all of the design objectives of the IC.

In contrast to manual custom IC design processes, and in response to ever-increasing pressures to reduce the time-to-market cycle time and the IC design cycle time, highly automated IC design processes have been developed. In general, known automatic IC design processes may be classified as, (i) fully pre-fabricated highly programmable component based design processes (e.g., field-programmable gate array (FPGA), etc.), (ii) partially pre-fabricated (e.g., gate array) based design processes: at the completion of the design process, only the metal layers need to fabricated, and (iii) design processes using standard, static pre-defined circuit building blocks (cells) having a pre-defined structure and layout, and fully customizable interconnections between the blocks wherein at the completion of the design process, all components (layers) in the design need to be fabricated from scratch. Among these three general automated design processes, the standard-cell based IC design process typically yields IC designs offering the highest performance, the smallest die size, and the lowest power consumption. Even so, the resultant IC designs achieved using standard cell design processes do not match the IC design quality possible with manual custom IC design processes.

Standard-cell based automated IC design processes use pre-defined logic cells from a library of circuit building blocks for use in the design of the target IC. The standard cells' descriptions are generally available at higher levels of abstraction than the transistor-level (e.g., the gate-level). Standard-cell based IC design processes also typically use computer implemented automated, algorithms to map a given design's functional description onto the given set of library cells. Although usually achieved in shorter design cycle times than manual full custom design processes, the quality of standard-cell based IC designs tends to be poor compared to manual custom designed ICs. This is typically due to the limitations imposed on the design process by the use of a fixed library of pre-defined (static) building blocks that are not uniquely customized to the needs of the IC design.

The proliferation of digital ICs, and the ever-increasing diversity of their applications have prompted the increased use of various metrics or evaluation criteria in measuring the performance and cost of development for ICs. Die size, performance/speed and power consumption have evolved as three of the most commonly used metrics. At the same time, time-to-market (i.e., design cycle time) and expected sales volume have gained importance as two commonly valued metrics. Generally, the time-to-market for IC designs is steadily decreasing for virtually all classes of digital ICs. While the importance of the various metrics varies widely from one IC design to another, two of the most commonly used metrics combinations are (i) performance and power consumption, and (ii) die size and power consumption.

The particular process adopted for a specific IC design application may depend on numerous technical and non-technical issues. As with many of the different IC design formats, there is a need in very large scale integration (VLSI) designs to contain the complexity of the IC design process. The complexity of the IC design process can be addressed depending on the design methodology (i.e., process) used to implement the IC, even complex ICs.

Traditionally, a hierarchical top-down design method is typically used to create an IC. The hierarchical approach allows the system to be specified at a number of levels in a progressive manner from a general description of the target design down to a detailed description of the components comprising the target IC design. Each specified level of the IC design description is derived from the preceding and more generally described higher level. Greater detail is added to the design at each successive lower level. Additionally, use of readily available structures such as ROMs, PLAs and RAMs have been employed to save design time.

Previous automated IC design processes have tried to bridge the performance and design quality gap that exists between the custom and standard-cell design processes by using various methods, including but not limited to, for example, improvements in the performance of a manually/semi-automatically generated design by sizing individual transistors; using greater transistor-level cell layouts once the cell functionalities have been identified; using manual/ semi-automated methods for generating transistor-level layout, since traditionally, transistor-level layouts involve extensive manual intervention (typically without regard to conformance to the highly automated nature of standard-cell based design flows); using new/improved methods for selecting better-sized library elements (constraints/objective-driven methods, for example delay-model driven sizing methods); using new/improved methods for creating unique (possibly dynamic and possibly capable of implementing universal logic) pre-characterized transistor logic elements; and using new/improved methods for adding variously sized library elements to a pre-defined existing library.

However, despite the efforts to bridge the performance and design quality gap between manual IC designs, and IC designs generated by automated design processes there remains a significant shortfall in the quality of automatically generated IC designs.

The present inventors have realized sources of deficiency in existing automated design processes. These include the static nature of the certain fundamental aspects of such automated IC design methods.

SUMMARY OF INVENTION

Digital complementary metal-oxide semiconductor (CMOS) IC designs can be broadly classified into a storage class that stores digital data, and a logic class that manipulates digital data. The present invention is particularly applicable to logic ICs and parts thereof. In general, the present invention is suitable for the design of, for example, application specific ICs (ASICs), application specific signal processors (ASSPs), etc.

The present invention involves the design of ICs by automatically generating design-specific cells created on the basis of design-specific information.

The present invention involves the design of ICs by appropriately using automatically generated design-specific cells created on the basis of analysis of the IC's specification, and an implementation of the IC using standard-cells.

The present invention also provides automatic partitioning of the target IC design into clusters of standard-cells or gates, with the objective of designing new design-specific cells.

Still another embodiment according to the present invention includes the automatic creation of unique design specific cells from clusters of standard cells identified in the target design, based on design-specific quality objectives, while minimizing the number of design specific cells created in the process.

It is still another objective of the present invention to provide automatic optimization of the design specific cells to create optimal implementation structures, both internal to the design-specific cell (i.e., at the transistor level), and at the global design/netlist level.

The process of optimizing a design for performance (clock-speed), through creation and use of targeted design-specific cells whose functionality/timing properties augment the functionality/timing properties of the standard-cells used on critical paths of the target IC design is yet another objective of the present invention. The critical paths themselves may be obtained either manually or automatically using timing analysis algorithms—static or dynamic. This includes the identification of cluster(s) of standard-cells of the critical paths (automatically/manually) which, when altered suitably through replacement by design-specific cell(s), can achieve desired timing.

DETAILED DESCRIPTION OF THE INVENTION

Figure 1:
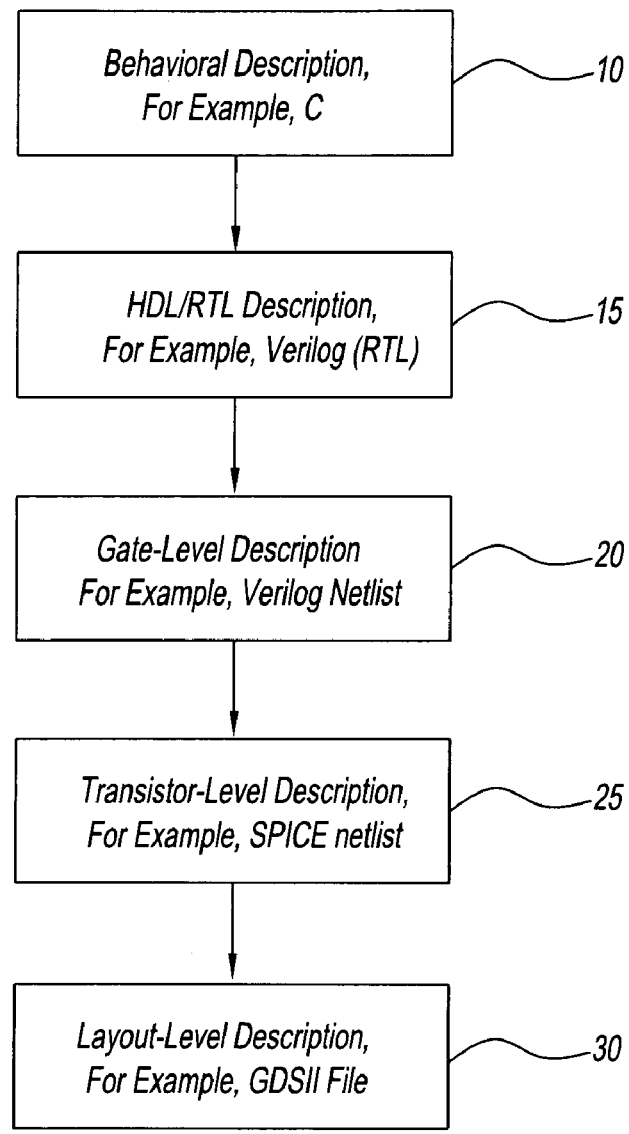
FIG. 1 is a block diagram depicting a conventional hierarchical top-down IC design approach.

The process of optimizing a design for area through creation and use of new design-specific cells that are useful for both critical and non-critical sections of the target design is an objective of the present invention. The design-specific cells for critical areas of the design are obtained using the same optimization techniques that are employed for performance optimization. The design-specific cells for non-critical sections may also be obtained either manually or automatically using information derived from timing-analysis algorithms (whether static or dynamic). This includes the identification of (manually/automatically) cluster(s) of standard-cells in the off-critical regions of the design, which, when altered suitably through replacement by design-specific cell(s), reduce the total number of transistors and/or improve the layout of the overall design, and thus achieves the desired area optimization.

The process of optimizing a design for its power consumption through creation and use of new design-specific cells that are useful for power-critical portions of the target design is still another embodiment of the present invention. The power-critical portions may be obtained either manually or automatically using power-profile analysis algorithms. Power optimizations include the identification of cluster(s) of standard-cells in the power-critical regions (automatically/manually) which, when altered suitably through replacement by design-specific cell(s), can achieve the desired power consumption targets.

The process of optimizing a design for its signal integrity/noise characteristics through creation and use of new design-specific cells that are useful for portions of the target design that are most critical to the signal integrity/noise characteristics of the design is yet another embodiment of the present invention. The critical portions may be obtained either manually or automatically using algorithms to analyze/estimate signal integrity/noise characteristics of the design. Signal integrity/noise characteristics optimizations include the identification of cluster(s) of standard-cells in those regions in the design that are critical for signal integrity/noise characteristics (automatically/manually) which, when altered suitably through replacement by design-specific cell(s), can achieve the desired signal integrity/noise characteristics in the target IC design.

The process of optimizing a design for its testability/fault-tolerance through creation and use of new design-specific cells that are useful for portions of the target design that are critical to its testability/fault tolerance is still another embodiment of the present invention. The critical portions may be obtained either manually or automatically using testability/fault analysis (e.g., inductive fault analysis) algorithms. Testability/fault tolerance optimizations include the identification of cluster(s) of standard-cells in the critical regions (automatically/manually) which, when altered suitably through replacement by design-specific cell(s), can ensure the desired testability/fault tolerance properties of the target IC design.

The process of optimizing a design for its routability is derived from achieving a reduced cell count. The reduced cell count is a result of replacing standard-cells with design-specific cell, especially when both critical and non-critical portions of the IC design are targeted.

The process of optimizing a design for any combination of objectives (e.g., area, performance, power consumption, signal integrity, testability, routability, etc.) by combined use of individual optimization processes, under the control of a higher-level optimization control process is also an embodiment of the present invention. Such process may include use of greedy/iterative algorithms, or more sophisticated design-space search algorithms, including but not limited to branch-and-bound search techniques, dynamic programming, exhaustive enumeration, etc.

The present invention bridges the existing gap between custom and standard-cell based IC design. In contrast to automatic/semi-automatic standard-cell IC design methodologies heretofore, the present invention provides custom design-like benefits, while retaining the automated nature of standard-cell based design processes. In an aspect of the present invention, the method of the teachings herein use an analysis of the target IC design in order to identify target sub-circuits, and to automatically implement efficient transistor-level designs of the target sub-circuits. The automatically implemented transistor-level designs make up a dynamic, custom library of elements that contribute to the high quality IC designs provided by the present invention.

The present invention may be completely automatic, or can use a degree of manual intervention. The completely automatic design process flow uses computer-implemented software programs for the creation of the transistor-level implementations, the physical layout and a characterization of the transistor implementation parameters, such as, area, performance, power dissipation, signal integrity, testability and reliability. The characterization aspects of the transistor-level implementations can be used by upstream design tools in the IC design process. The present invention uses the dynamic creation of design-specific building blocks or cell to achieve a highly optimized implementation of the target IC design. The present invention is fully compatible with, and may further use pre-existing static library elements or cells in the process of automatically creating IC designs. Superior IC designs are possible using the dynamic IC design process presented, as measured by using the conventional metrics used for measuring the performance of IC designs. In particular, die size (area), performance, power, signal integrity, testability, reliability, etc. can be used as design metrics.

An important aspect of the present invention is the ability to dynamically create highly customized design-specific cells, the functionalities of which are compatible and beneficial to achieving the target IC design. The dynamic cells created do not exist in a pre-defined standard-cell library. In accordance with the present invention, the dynamic cells created are suitable for use in automated standard cell design processes, thereby achieving "custom-like" IC design results without incurring the expensive design costs associated with custom design processes.

The present invention provides a method for designing ICs, including the steps of: analyzing and optimizing a target IC design based on design-specific objectives; partitioning the optimized target IC design into pre-defined standard-cells from one or more libraries and creating design-specific cells specifically having unique functionality and characteristics not found amongst the standard-cells; identifying and determining a unique minimum subset of the standard-cells and design-specific cells, the interconnection of which represents the target IC design; generating the necessary views, including layout and characterizing of the design-specific cells included in a minimal subset, wherein the IC design is subject to objectives and constraints of the target IC.

The steps of, for example, partitioning, determining the minimal subset, and characterizing the design-specific cells are repeated until the design-specific objectives for the target IC are satisfied.

In accordance with the present invention, the method may include the steps of comparing the dynamic-cells with one or more libraries of standard-cells; and replacing the design-specific cells with elements from the standard-cell library (or libraries), that satisfy the design-specific objectives and constraints. Note that even when such elements exist in a library, existing synthesis tools often fail to find the elements, and that the use of one or more design-specific cells in the target IC design may make it possible to replace some other design-specific cells with existing elements from the standard-cell library.

The step of characterizing the design-specific cells further includes analyzing the characteristics of the design-specific cells in a context-sensitive manner, i.e., considering the design-specific context in which each design-specific cell is used.

The present invention may also include the steps of identifying one or more design-specific cells in a power-critical portion of the target IC design; and optimizing the power consumption characteristics of the design-specific cells thus determined, to improve power consumption of the target IC design. Optionally, the present invention may include the steps of: identifying one or more design-specific cells critical to improving the signal integrity of the target IC design; and optimizing the characteristics of the design-specific cells thus determined to improve signal integrity of the target IC design.

The present invention may include the steps of identifying one or more design-specific cells critical to testing and fault tolerance of the target IC design; and optimizing the characteristics of the design-specific cells thus determined to improve the testability and fault tolerance characteristics of the target IC design.

A traditional top-down hierarchical approach to IC design is illustrated in FIG. 1. The description of the function to be performed by the IC is specified in step 10 in, for example, C language. At step 15, the description is expressed in a Hardware Description Language (HDL) in a manner that is largely independent of the physical design of the IC function. Verilog is an example of a suitable language. Using the HDL description, a gate-level representation of the IC design is made at step 20. The gate-level representation of the IC is expanded in step 25 to describe the IC at the transistor-level. An automated circuit modeling and capture application, such as for example, SPICE can be used to evaluate the transistor-level representation of the IC in step 25. The next step in the top-down approach is the layout of the described and designed IC at step 30. The layout-level description is preferably in a format adept at describing graphical representations, such as, for example, Graphic Design System II (GDSII).

Although the top-down hierarchical approach theoretically provides excellent IC design process control, the IC design process rarely progresses in a strict top-down manner. In practice, both the top-down and a bottom-up design flow is used because the IC design process often involves iterations progressing from top-down and bottom-up in an attempt to meet the IC specifications. For example, if a system designer specifies architecture (i.e., a top-level description) without an accurate estimate of the corresponding circuit area (i.e., a bottom level description), then it is highly probable that the resultant IC layout will exceed the maximum area permitted for the IC. In this example, in order to meet the allowable maximum area constraint, certain functions of the design may have to be removed from the design (e.g., a repartitioning of the system) and the design process repeated until an IC design having an acceptable circuit area is achieved.

As mentioned above, the manual, full custom approach to designing ICs is prone to error. A hierarchical, manual design process is especially vulnerable to the introduction of errors at the layout stage where the detailed information describing the design is the greatest and thus, most complex.

For very complex yet high-volume selling circuits such as microprocessors, there is a need to efficiently use every square micron of the silicon comprising the IC in order to achieve the maximum yield at the minimum cost. In such cases, manual design processes are often applied to major parts of the circuit to achieve maximum use of the IC silicon.

Figure 2:
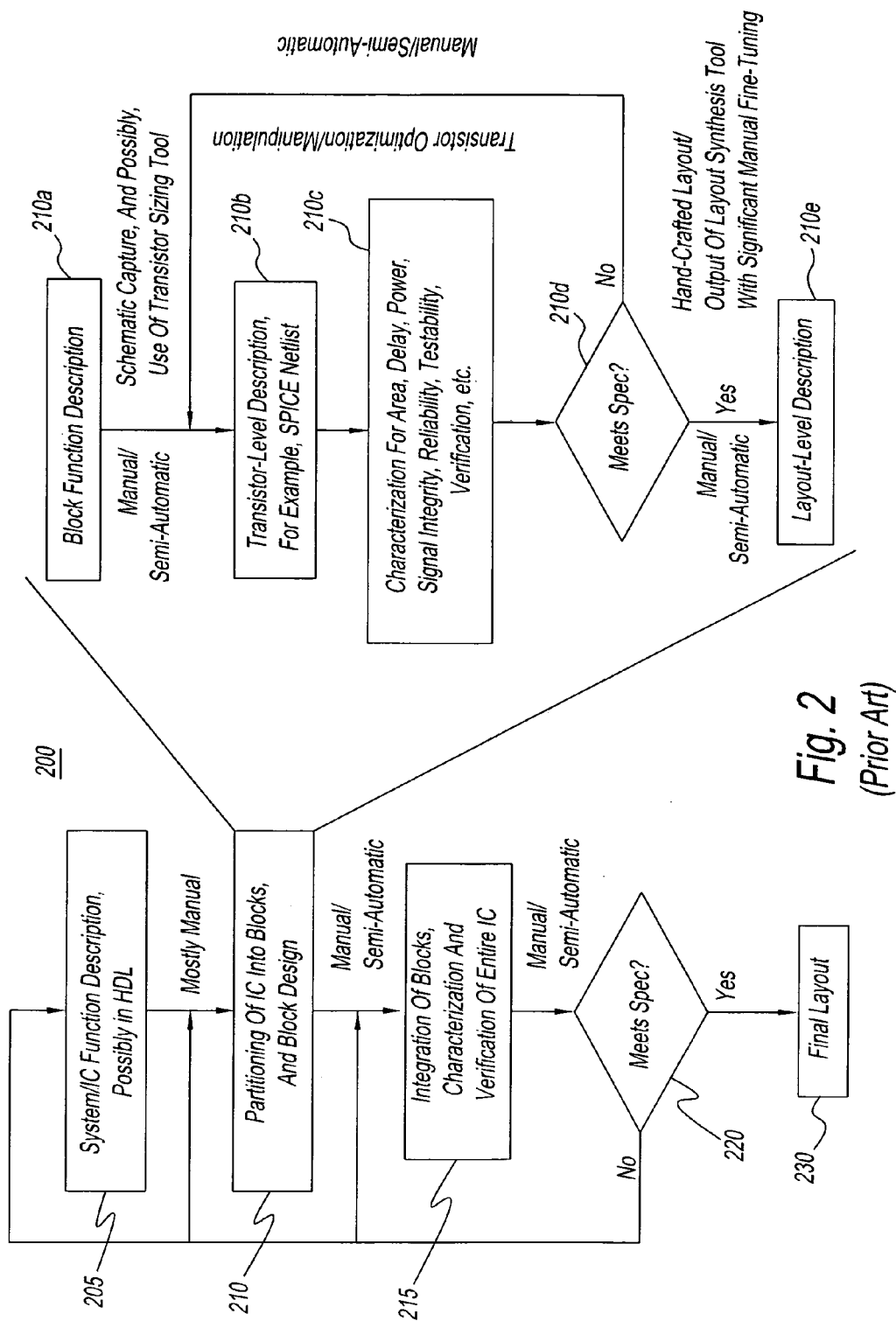
FIG. 2 is a flow diagram depicting a conventional fully customized IC design process.

FIG. 2 illustrates a fully customized IC design process flow 200. The full-custom methodology 200 starts with a system/IC function description at step 205. The IC design is then partitioned into functional blocks in step 210. As shown in steps 210a–210e, the partitioned blocks are further described and implemented using a top-down hierarchal approach. The blocks are described in step 210b using manual or semiautomatic tools to capture and describe the transistor-level representation of the functional blocks. This design step typically includes pre-layout transistor-level simulation using simulators such as SPICE. This is typically a labor-intensive and time-consuming manual process. Beyond this stage, some design tool assistance is usually employed to complete the system description. Layout design tools or other automatic/semi-automatic tools for implementing transistor layouts based on a transistor netlist representation may be used to complete the transistor-level description of the system.

At step 210c, the functional blocks are characterized to verify and characterize the implemented design in terms of conventional metrics, such as layout design rules, delay, power, signal integrity, testability, area, signal, power dissipation, reliability, testability, and other verifiable constraints. It is determined in step 210d whether the functional blocks meet the specifications of the target IC design. If it is determined that the functional blocks satisfactorily meet the specifications for the IC design, then a layout description for the functional circuit block is generated at step 210e. The process typically iterates until the design constraints are satisfied. The verification and characterization step is usually invoked in order to accurately understand the behavior of the implemented circuit (especially timing behavior) and to provide assurances that the design can be manufactured reliably.

The IC design then proceeds with integrating the circuit blocks in step 215. The IC design is verified and it is determined whether the proposed design meets the specifications for the design at step 220. As shown, the design process can iterate until the resultant design meets the required specifications. Once the IC design meets the specifications, the final layout of the IC design can commence at step 230.

Full-custom design processes are particularly useful where portions of the target IC design repeat often, and for blocks that are in the critically important portions of the design. Under such circumstances, the time and expense required for a full, custom design are justified by the high quality results of full custom IC design. For example, full, custom designs are used for memory cell designs, arithmetic block/datapath designs, etc.

Standard-cell based IC design methodologies use low functionality circuit building blocks or cells. Standard-cell based design methodologies typically use a library of pre-existing cells or elements as the building blocks of an IC in the IC design process. In the IC design processes using standard-cells, the standard cells are interconnected to form larger building blocks for use in the overall IC design. The assembly of larger building blocks is repeated until the entire IC design is completely captured by interconnected standard cells.

Standard-cell based IC design processes are used in full or partial automation of IC designs since the standard cells used to describe the IC design are pre-determined entities having known characteristics. Each standard-cell may have multiple implementations to provide different, yet still pre-defined, characteristics to hopefully suit the IC designer's specific needs. Characterization of each cell is performed by the standard-cell designer/manufacturer in terms of delay time versus load capacitance, and other parameters so that IC designers know the standard-cell's characteristics.

To complete the IC design process using standard-cells requires a complete mask set for the target design. This requirement makes this design process more expensive than other pre-fabricated design processes (e.g., gate arrays).

It is noted that in order to facilitate the manufacture, layout and interconnections between standard-cells, standard-cells are typically designed with a fixed height, or a multiple of the fixed height. The width of the assembled standard cells can vary to accommodate various target ICs. In modern standard-cell designs, connections are routed within the cell (i.e., intracell), between cells (i.e., intercell), and over cells (i.e., over-the-cell). Sophisticated routing algorithms and applications are used to accomplish the routing of the cells.

Figure 3:
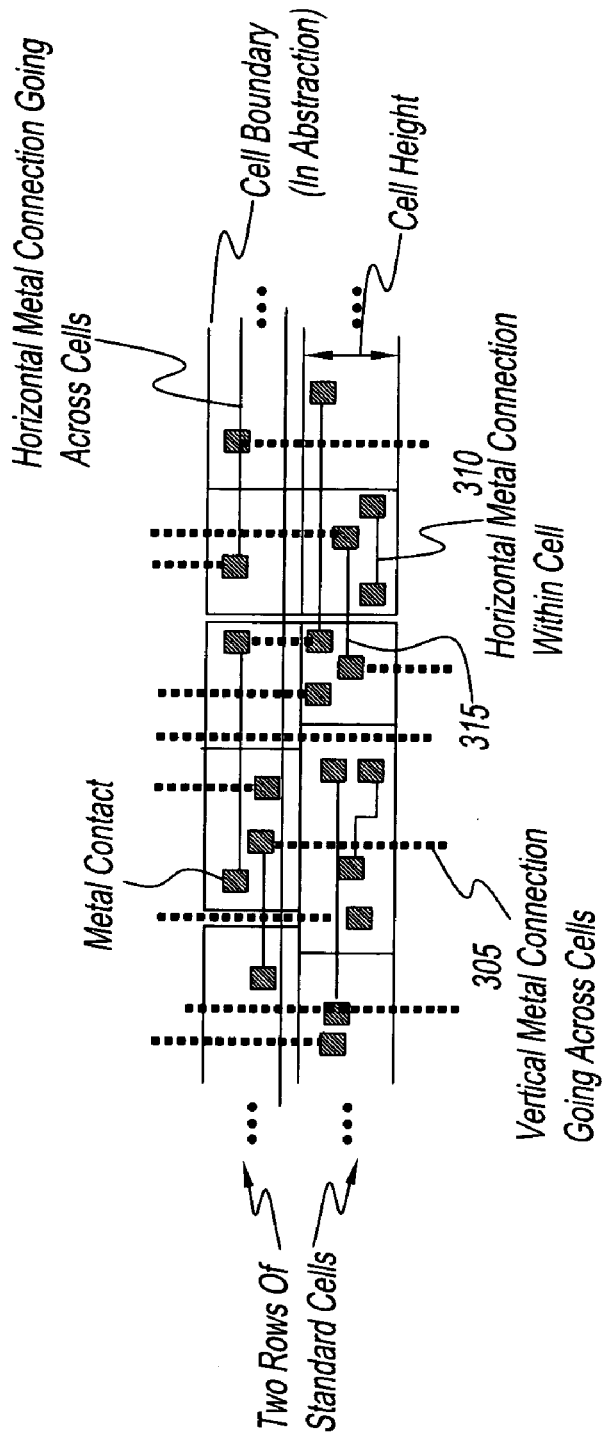
FIG. 3 is a block diagram depicting exemplary structure of a portion of a standard-cell based design.

An abstract view of a portion of a typical standard-cell based design, is shown in FIG. 3. Note that the interconnects extend intracell 310 and intercell 315. The interconnects are also routed in both a vertical 305 and a horizontal direction 310. FIG. 3 is a snapshot of a portion of a typical modern standard-cell based design, depicting two rows of standard cells, and over-the-cell routing of interconnects, assuming 3 layers of metal connection; actual orientation of "horizontal" and "vertical" is design-specific.

Figure 4:
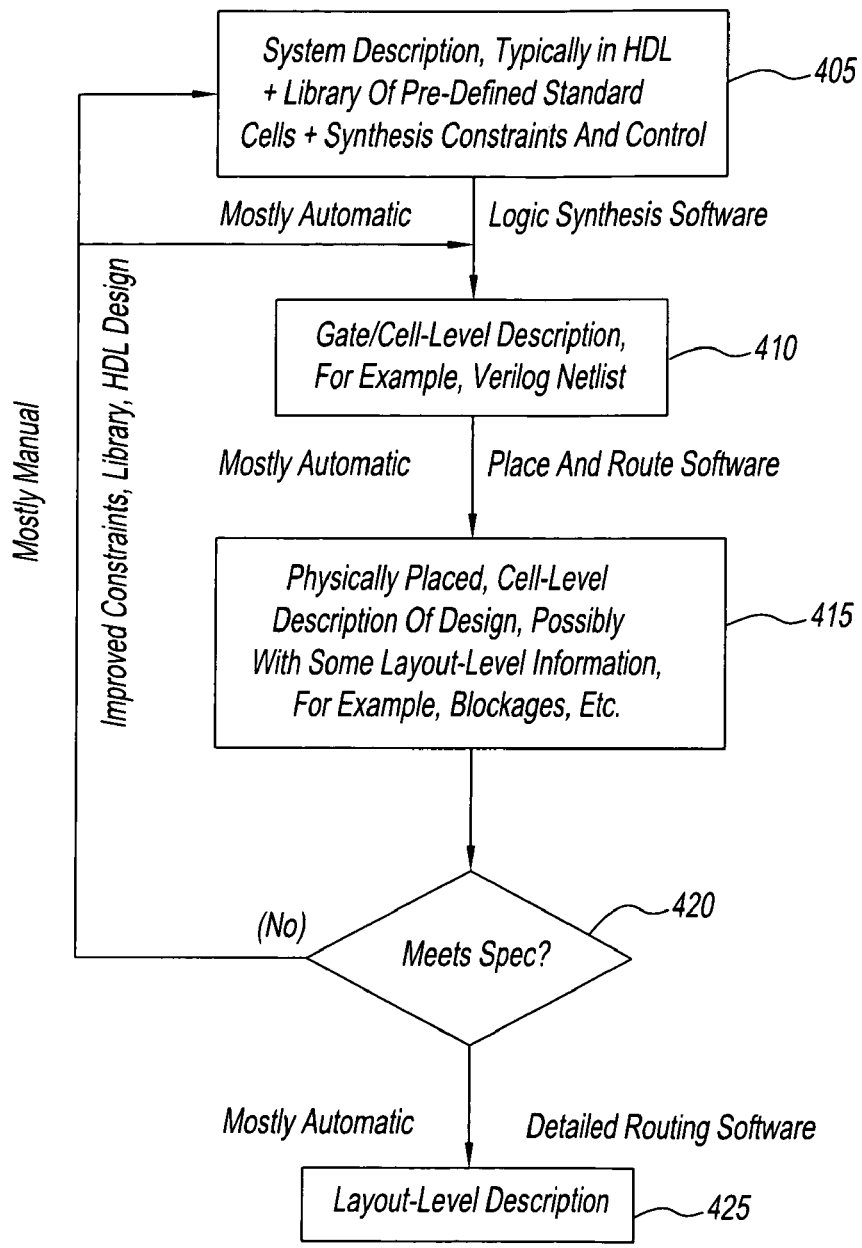
FIG. 4 is a flow diagram depicting a conventional design process for creating IC designs using standard-cell libraries.

From a designer's perspective, a typical standard-cell based design flow includes IC design synthesis and place-and-route steps. Referring to FIG. 4, the design synthesis tools accept as inputs a given IC design description in a useable format, such as, for example, register-transfer level (RTL), HDL, behavioral language, etc. in step 405. As shown, step 405 also includes the library of pre-defined standard cells and other synthesis constraints imposed on the particular IC design that are used in describing the IC design. A netlist is then generated in step 410, which is an interconnection of the pre-defined cells from the standard-cell library. Place-and-route tools, mostly software implemented, are used to create an IC design layout utilizing the pre-defined layouts of the standard-cells in step 415 while preserving the interconnections between the cells specified in the netlist. Place-and-route tools preferably take into account the many detailed timing issues that arise from the placement locations of the cells in the IC design layout. The generated IC design is evaluated for compliance with the specifications for the target IC design metrics in step 420. The standard-cell based design process iterates by returning to steps 405 and/or 410 until the specifications are met. The design may have to be modified by returning to step 405 as shown.

A persistent problem with the conventional standard-cell based IC design processes is timing convergence. This problem has increasingly become a concern with shrinking device geometries and the migration of IC designs into the deep sub-micron feature era. The timing closure problem arises because standard-cell synthesis tools do not have direct control over the physical placement of the cells, nor over the actual routes taken by the interconnections between the cells. As a result, the synthesis tools adopt a "best estimate" of the wire delay between the standard-cells. Design processes using time delay estimates have become increasingly inadequate due to, (i) the large size of today's designs, and (ii) the increasingly large interconnect delays relative to gate delays in deep sub-micron IC designs, and the contribution of such delays to the total delay along a path in the design.

In order to alleviate the timing closure problem, some standard-cell IC design processes propose separating the physical placement and routing steps into multiple, sub-steps. Some IC design methodologies couple some or all of the placement and routing sub-steps closely with the synthesis step itself. By doing so, the IC synthesis system is able to obtain better timing estimates based on global placement and routing information.

Figure 5:
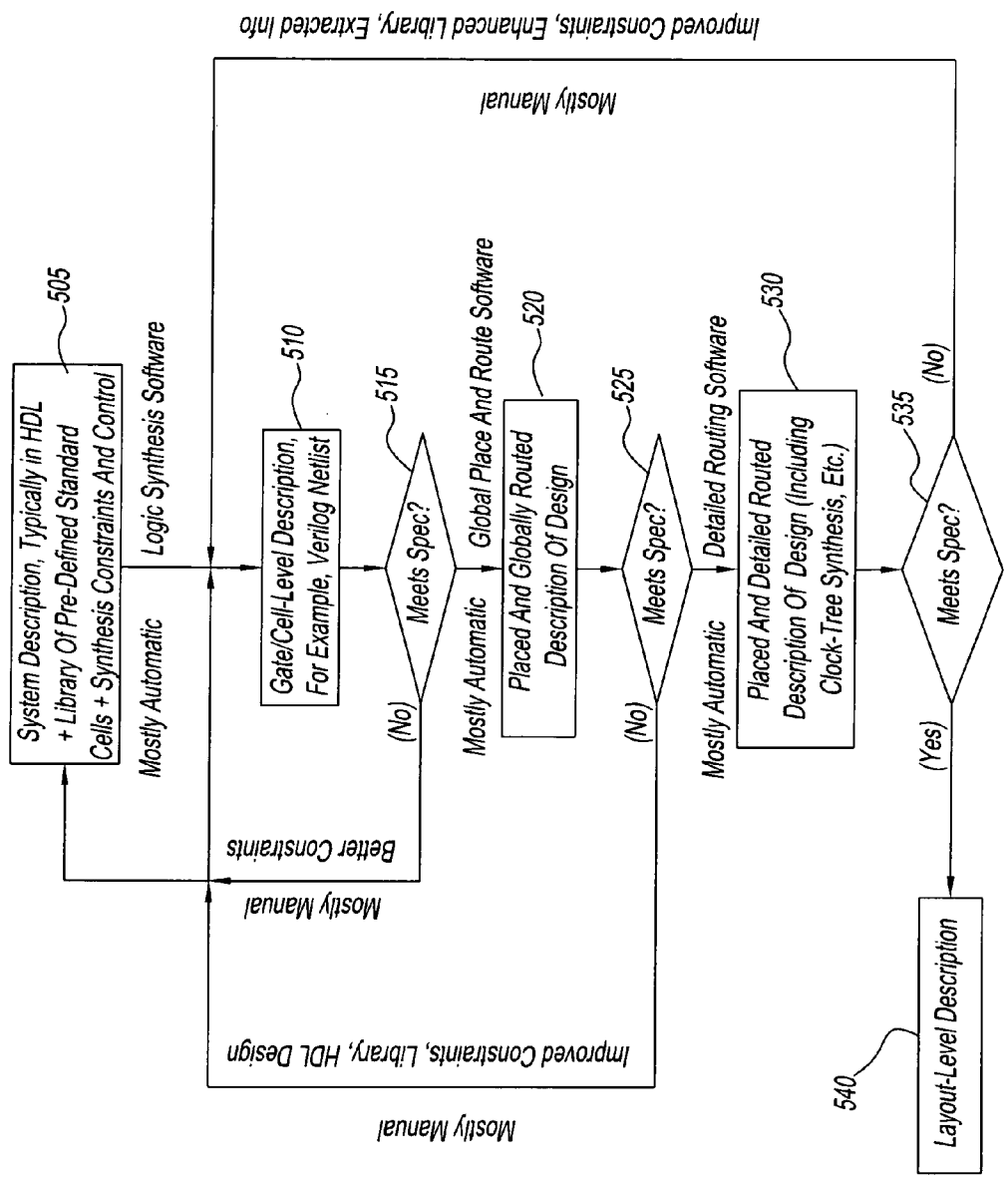
FIG. 5 is a flow diagram depicting a conventional IC design process flow having separated physical placement and routing steps.

Simple logic transformations such as gate sizing, buffer insertion, pin permutation, etc., that can be performed without a complete logic re-synthesis, have also been introduced into some IC design processes in order to alleviate the problem caused by the decoupling between logic synthesis and the physical design flows. This is illustrated in FIG. 5, which in large part is analogous to FIG. 4. In distinction to FIG. 4, step 520 shows the place and route description of the IC design as an integral part of the design process, verified for compliance to the design specifications (step 525). It is shown how the placement and routing of the standard cells, and timing effects thereof, are considered in the design process, steps 525 and 530, prior to the actual placement and routing of the standard cells interconnects in step 540.

Figure 6:
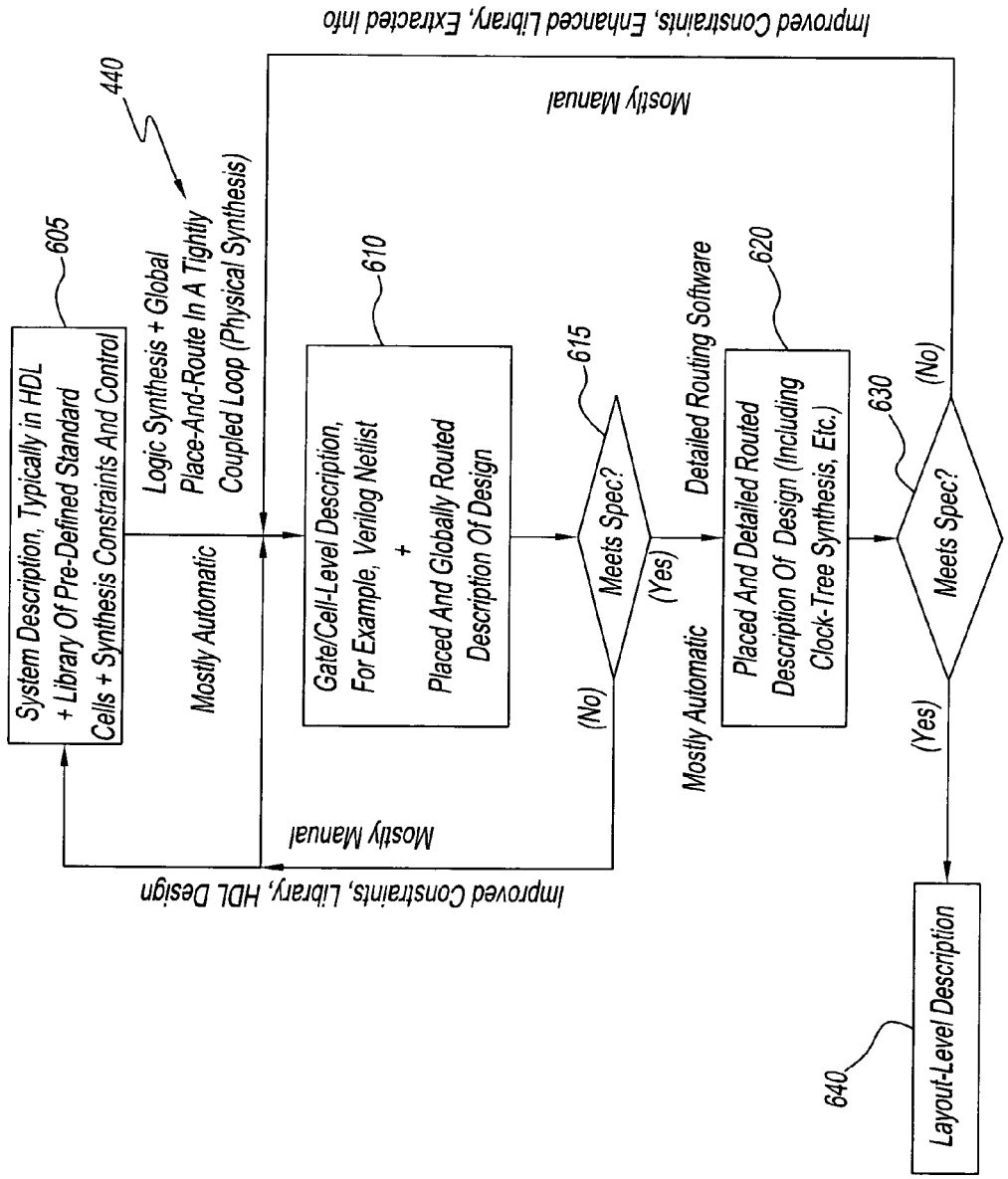
FIG. 6 is a flow diagram depicting a conventional standard-cell based design flow for deep sub-micron (DSM) technologies, capable of performing both logic and layout synthesis.

As mentioned above, automated IC design processes have attempted to address the problem that exists due to the lack of adequate interaction between the logic synthesis and physical design systems. These automatic design processes have proposed a complete synthesis system that is capable of performing both logic and layout synthesis. An example of this type of design process is illustrated in FIG. 6.

Despite such improvements to automated IC design processes, a key problem remaining for IC designers using automated IC design processes and synthesis tools is related to the use of circuit components (e.g., elements and cells) from a pre-defined, static standard-cell library. Standard-cells are typically developed for use in a wide variety of digital ICs. As a result, pre-defined standard-cells tend to be relatively small and general-purpose. Thus, when used in a given IC design, conventional IC design processes using standard-cells typically yield ICs having significant transistor-level redundancy. That is, many of the transistors in the resultant IC design can be eliminated without affecting the functionality or performance of the IC.

Comparisons between designs created by a standard-cell based automated IC design process, and those created by a fully handcrafted custom IC design process routinely reveal that the customized IC design processes yields designs having significantly fewer transistors, without sacrificing functionality.

Additionally, such comparisons show that custom designs tend to use relatively large transistor-level building blocks (analogous to cells) that localize a lot of the interconnects within such building blocks. In contrast, standard-cell based designs, created using automated design processes, tend to use comparatively small standard-cells and a profusion of interconnects therebetween.

There are many negative design implications due to large transistor count redundancy, and the profusion of small cells and inter-cell interconnects. Increased die size, lower performance, and increased power consumption are some of the criteria adversely impacted. A comparison of manually crafted IC designs and automatically generated IC designs reveals a noticeable difference in the usage patterns of various layers in the IC designs. Handcrafted custom designs tend to use all the layers, including diffusion and polysilicon layers, very effectively and efficiently. In contrast, automatically generated designs tend to use diffusion and polysilicon layers relatively sparsely, while using the metal layers profusely.

This profusion of metal interconnects in automatically generated IC designs adds to the increasing problem of inadequate performance and high power consumption for IC designs migrating into deep-sub-micron geometries such as 0.10 micron, or smaller. Many of IC design problems can be attributed to the timing, power, and performance problems discussed above.

The problem related to automated IC design processes, namely, excessive die size, slow timing and/or timing closure problems, routing congestion in the metal layers, signal integrity, noise, etc., are in large part attributable to the fact that automated IC design processes, using static, standard cell circuit blocks, are not flexible or highly adaptable to individual IC designs.

A target IC design created in accordance the present invention is not limited by the use of a library of pre-existing, standard-cells. The present automated IC design process is based on the creation of new building blocks or design-specific cells that are dynamically added to the set of available cells, during design and implementation of the target IC design. The functionality of the design-specific cell is determined based on the desired functionality and the constraints of the target IC design.

In accordance with the present invention, a method of designing ICs is presented providing the numerous benefits to the automated design of ICs. Accordingly, better utilization of the IC design area (die size) is possible. By using sophisticated transistor-level cell generation techniques, a substantial reduction in transistor count for individual cells is possible, thereby reducing the necessary die size requirements. In addition, by combining the functionality of multiple, standard-cells into one design-specific cell, overall cell and wire counts in the overall design are reduced. This in turn enables place-and-route tools to generate a more compact (i.e., high utilization) layout having significantly less unused IC chip space.

In an aspect of the invention, better timing characteristics are achieved. Compared to multi-level implementations having the same functionality using logic synthesis, the dynamically created design-specific cells of the present invention exhibit significantly improved timing for signals on the power and signal critical path(s), while potentially reducing the timing slacks for signals in the non-critical portions of the design. Furthermore, reduction in overall cell counts and cell interconnects enables place-and-route tools to generate compact (i.e., high utilization) layouts, as mentioned above. This further improves the timing of the target IC design.

The present invention beneficially provides for reduced power consumption. The reduction in the number of transistors required to implement the functionality of the target IC design, leads to a reduction in the total junction capacitance. Additionally, the reduction in the number of intercell connections preferably reduces the total interconnect capacitance. Since power dissipation is common CMOS designs in directly related to the amount of switched capacitance, both of the above factors reduce power consumption of the design.

In another aspect of the present invention, the routing of the IC design is enhanced. Reductions in the overall cell count, and a proportionate reduction in the number of intercell connections improves, the routing of the target IC design. Other improvements are achieved through the use of buffer insertion and buffer encapsulation steps in the design process presented herein.

Timing convergence problems of IC designs are better addressed and alleviated by the present invention. IC designs made in accordance with the present invention have improved timing convergence characteristics. The creation of large (i.e., macro-cells or mega-cells) increases the average cell delay. The functionality enabled on a per cell basis for the macro-cells is increased as compared to standard-cells. Reductions in the overall wire count results in better routing and a reduction in the average wire length. These factors cooperate for a significant reduction in the wire-to-cell delay ratio. Lower wire-to-cell delay ratios enable more accurate timing estimates at the cell-level generation stage, and thus better timing convergence characteristics for the IC design at the layout stage.

Better signal integrity is also achieved due to cell count reductions gained by using design-specific cells optimized to meet the design objectives of the target IC, and a proportionate reduction in the overall wire count. Signal integrity is enhanced, in part, because the place-and-route tools have fewer wires to route in the available routing channels.

It should be appreciated that better reliability is obtainable as a result of ICs designed in accordance with the present invention. The reliability of the design-specific cells generated in accordance with the present invention can be optimized until the desired reliability is achieved since the design process is dynamic. That is, the design process actively considers the specifications of the target IC and other constraints (e.g., transistor sizing for the cell structures).

It is noted that although described as individual benefits realized by the present invention, various combinations of these and other benefits may be obtained, depending on the target IC and its design objectives and constraints. Accordingly, some or all of the benefits discussed herein may be realized in a single IC designed in accordance with the present invention.

It is noted that the enhancements in design synthesis and place-and-route technology of the present invention are preferably orthogonal. That is, the improvements realized are complimentary, and additive in nature. Thus, the sum of the benefits is preferably greater than the individual benefits in isolation.

Figure 7:
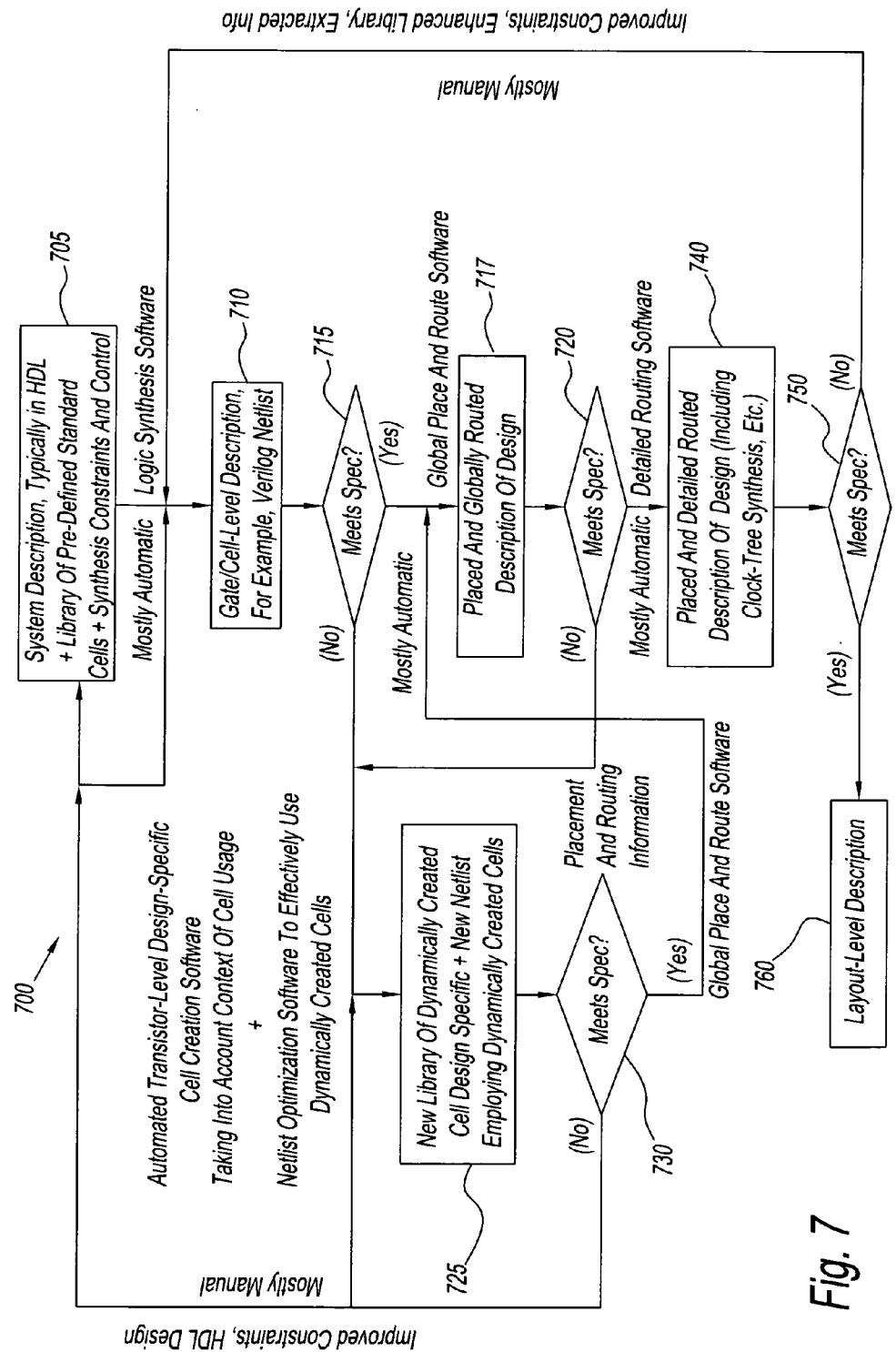
FIG. 7 is an exemplary flow diagram depicting the design process flow according to the present invention, including interaction with separate logic synthesis and global place-and-route steps.

An exemplary flow diagram encompassing the present invention in context of the a design process having separate logic synthesis, and global place-and-route steps (such as that shown in FIG. 5, for example) is depicted in FIG. 7. As discussed above with reference to FIG. 5, the IC description is provided in step 705 in HDL format. Also provided is a library of standard-cells, and the synthesis constraints and other controls imposed on the target IC. Using mostly automatic logic synthesis tools, gate- and cell-level descriptions of the target design are provided at step 710. A determination is made at step 715 whether the cell-level description meets the design specifications at step 715. If so, global place and route tools are used to determine physical placement of cells and route the interconnects therebetween at step 717.

If it is determined that the cell-level description thus generated does not meet the design specifications at step 715, then a design-specific cell is created at step 725, wherein the design-specific cell generation process dynamically considers the design constraints and cell usage (i.e., context). A netlist optimization tool, e.g., a software application, is also employed at step 725 to obtain a new netlist for the target IC design, which makes effective use of the dynamically created design-specific cells. The netlist employing the design-specific cells is evaluated to ensure that it meets the target design criteria, at step 730.

If it is determined that target IC design representation using the design-specific cells (and possibly standard-cells) does not meet the design specifications, then the process reverts to step 725, or step 705, depending on, for example, how close the design representation is to meeting the specification at step 730.

If it is determined that the design representation at step 730 does meet the target design specifications, then the process can proceed to the place and route steps of step 717, and proceed to the optimization (step 740) and layout (step 760) stages of the design process 700. As shown, design process 700 can iterate at steps 715, 720, 730, and 750 back to higher level design steps until the design specifications are met at the respective steps.

Accordingly, an IC design implemented in accordance with the present invention as exemplified in FIG. 7, improves the quality of the target design by virtue of the creation and use of the design-specific cells. Generation of such design-specific cells is guided by the design objectives for the target design.

Figure 8:
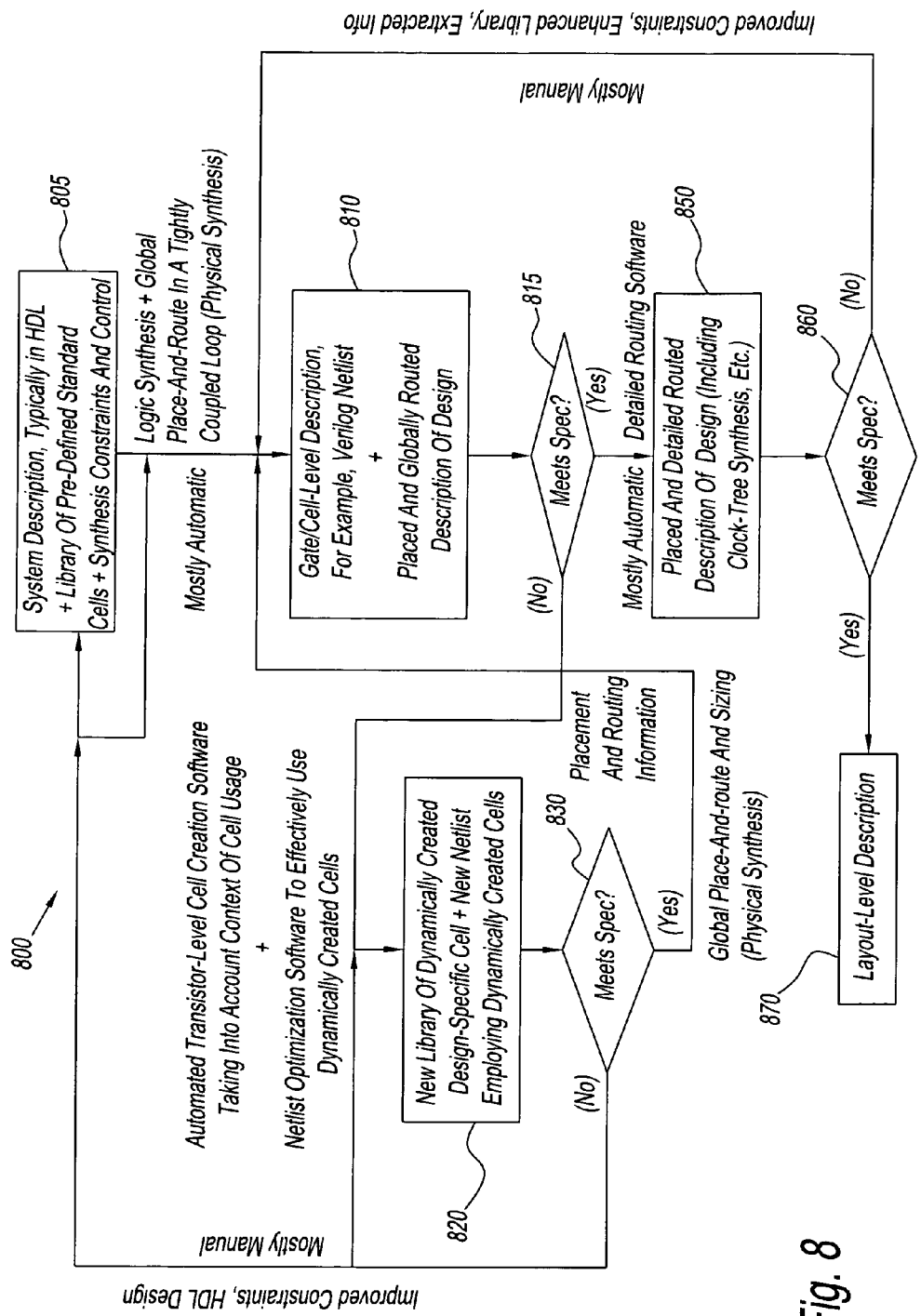
FIG. 8 is an exemplary flow diagram depicting the design process flow according to the present invention, including interaction with an integrated logic synthesis and global place-and-route (i.e., physical synthesis) step.

FIG. 8 is analogous to FIG. 7 in large part. However, it is noted that the logic synthesis, and the place and route stages of the design process shown in FIG. 8 are combined in step 810. Otherwise, an understanding of FIG. 8 should be apparent to those skilled in the art given the foregoing description of FIG. 7

Figure 9:
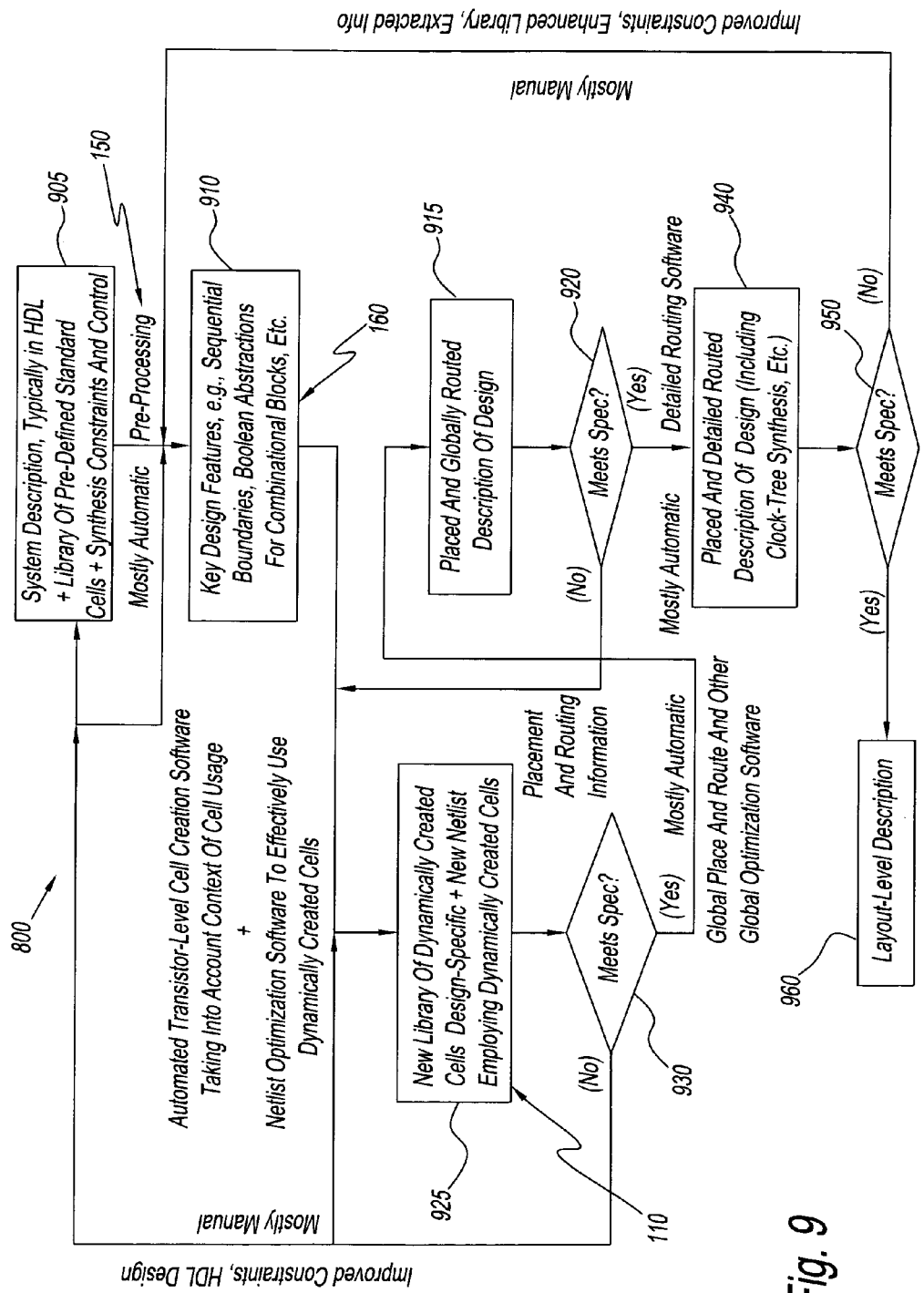
FIG. 9 is an exemplary flow diagram depicting the design process flow according to the present invention, including description of a target IC design in high-level description language (HDL) and an absence of interaction with any logical synthesis step, while allowing for possible interaction with global place-and-route step.

In yet another aspect of the invention, an exemplary embodiment of a design process 900 without a logic synthesis step, while allowing for interaction with global place-and-route step 915, is shown in FIG. 9. In this embodiment, pre-processing occurs at step 910 to determine key features of the design, such as, sequential boundaries, Boolean abstractions of combinational logic, etc. This step is followed by the design-specific cell creation and new netlist generation process of step 925, in a manner similar to that described above.

The remainder of FIG. 9 should be apparent to those skilled in the art given the previous discussions above with respect to FIGS. 7 and 8.

Figure 10:
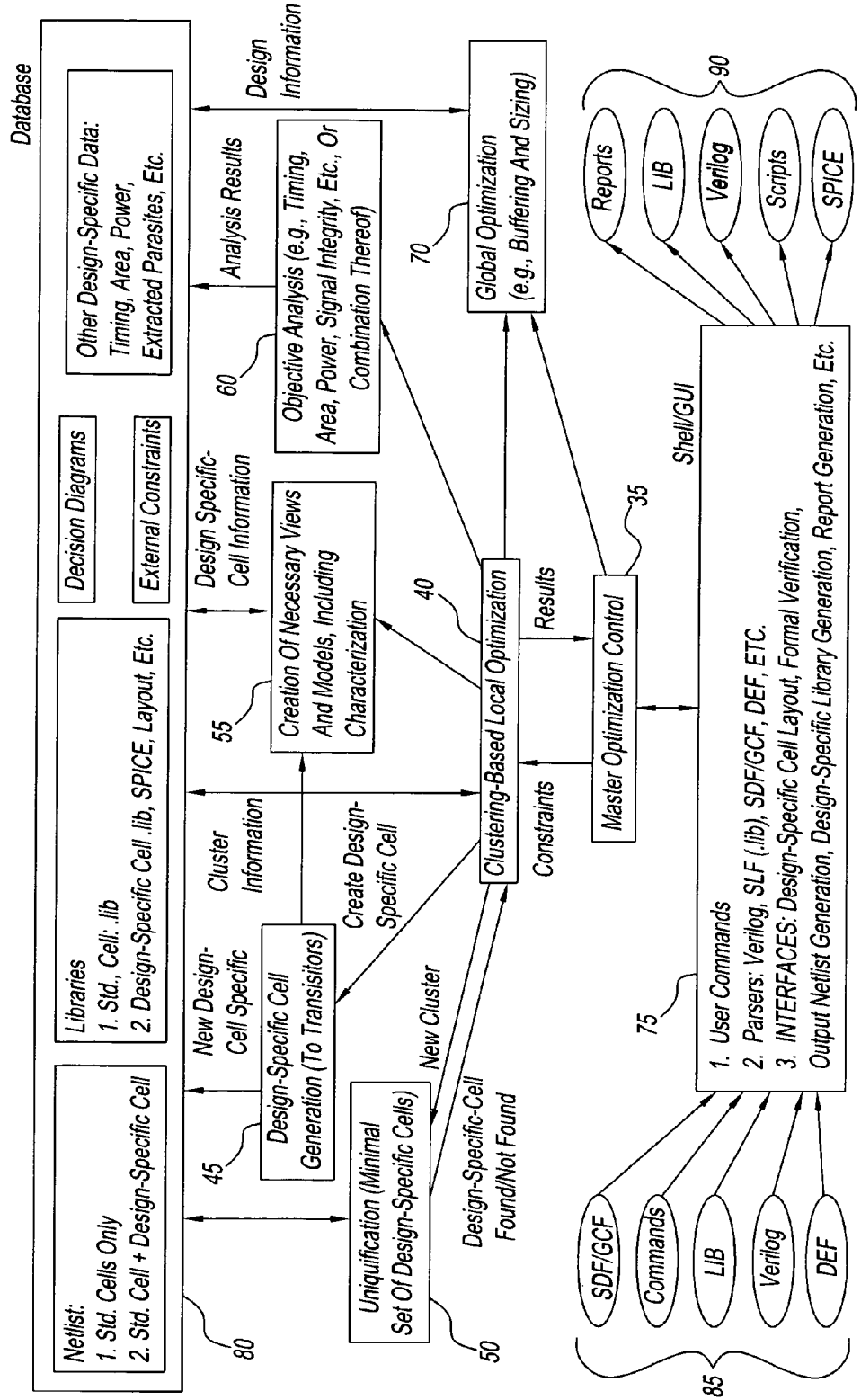
FIG. 10 is a block diagram depicting organization of software modules in accordance with aspects of the present invention.

A detailed block diagram showing an exemplary organization of software modules employed in an implementation of the present invention is provided in FIG. 10. Reference may be made to FIGS. 7 through 10 throughout the following detailed discussion of system 1000.

Given a target IC design for, but not limited to, a CMOS IC and, standard-cell based design methodology, an optimal set of cells and design-specific cells can be identified and described using circuit analysis and decomposition algorithms. The design-specific cells in the thus identified optimal set of cells may then be implemented using various cell creation techniques. The unique cells, both the design-specific cells and standard-cells identified, can be refined and tuned (i.e., optimized) using transistor sizing and other optimization techniques for optimizing various parameters such as timing, area, power consumption, etc. for the target IC design. The resulting netlist of interconnects for the identified and created cells may contain fewer, albeit possibly larger cells (i.e., macro-sized design-specific cells), as compared to netlists generated by conventional IC design methods solely using libraries of standard-cells. The resulting netlist, utilizing both design-specific cells and standard-cells, will generally have proportionately fewer interconnect wires interconnecting the generated cells. The design-specific cells are preferably compatible with the design rules of the fabrication method employed for the target IC, such as cell pitch of a given standard cell library, cell height, etc. Thus, the design-specific cells are preferably compatible with the standard-cell used in standard-cell based IC design processes.

In accordance with the invention, a detailed analysis of the target IC design, and identification of target cell-level clusters (i.e., interconnections of standard-cells) that can be optimized by replacing some or all of the standard-cell clusters with design-specific cell(s) (40). Techniques based on constraint-driven network partitioning, such as, but not necessarily limited to, dynamic programming may be used in this phase of the target IC design.

The invention also performs a uniquification step 50 to identify the minimal number of functional cells required to adequately represent the target IC. A compaction step is preferably performed to further optimize the arrangement of the cells. This phase of the IC design process can be based on methods, such as, but not necessarily limited to, functional signature computation, timing-driven signature computation, etc.

Furthermore, if a standard-cell library is available, the present invention preferably identifies near or exact functional matches of the generated design-specific cells with the available (if any) standard-cells in the standard-cell library. In a preferred embodiment, the invention does not create unique design-specific cells if such design-specific cells can be adequately implemented using pre-defined standard-cells (including possible constraining of the inputs of a standard-cell appropriately).

The context in which the design-specific cell(s) will be used in the target IC design is analyzed so that a set of optimal performance, area (i.e., size), and other constraints can be generated for each candidate design-specific cell.

The present invention, as depicted of FIG. 10, can take, as its inputs 85, cell-level library based design descriptions; placement and routing information (e.g., global routing information); HDL, or other description language descriptions (optional); design objectives; and pre-defined standard-cell libraries (e.g., gate-level and transistor-level implementations of, for example, Boolean gates). Inputs to user interface 75 may be formatted as, for example, Standard Delay Format (SDF), General Constraint Format (GCF), Synopsis library description file, and Delay Exchange Format (DEF).

Generally, a preferred embodiment of a system implementing the present invention includes the important aspects outlined in FIG. 10:

A master optimization control 35 controls the manipulation of the design with respect to the design objectives/constraints (e.g., area, delay, power, signal integrity, routability, etc.). The optimization of the target IC design can include using objective-estimation/evaluation algorithms and tools such as those useful for optimizing timing analysis, area estimation, power estimation, etc.

The clustering-based local optimization control 40 for partitioning the target IC design into functional clusters for implementation as design-specific cells, subject to design objectives/constraints is provided. Control 40 can use global objective analysis results to guide the cluster-creation process, and the local optimizations that follow. Control 40 includes use of transistor sizing in, and around design-specific cells created dynamically, to provide fine control over the resultant design-specific cells' behavior.

As mentioned above, a uniquification stage 50 is preferably included. Module 50 controls the performance of minimizing the number of functionally design-specific cells used in the design process.

Design-specific cell generation/publishing procedure 45 accepts as inputs, clusters of standard-cells, the constraints on the candidate design-specific cells (e.g., area, delay, power, etc.) and generates the transistor-level netlists for the determined design-specific cells.

Control module procedure 55, for creating the necessary models and views that may be necessary at other levels of the design abstraction (for example, at the gate-level, for various stages of testing, etc.), or for interfacing to relevant tools used in other parts of the design process (e.g., place-and-route tools, or timing analysis tools) is preferably provided as shown. The process of detailed characterization is preferably performed under the control of control procedure 55.

An objective analysis control 60 for analyzing the degree of target objective satisfaction, for example, performance, area, power consumption, etc. is provided to ensure that the generated design-specific cells and the standard-cells proposed for implementation in fact meet the design criteria. A global optimization procedure 70 that performs optimizations affecting the entire IC chip or block under consideration is also provided as part of system 1000. Common examples of such optimizations include buffering and transistor sizing.

Database 80 is provided to contain data used in the design process in accordance with the present invention. The included data can include information about the target design, the standard-cell library (libraries) being used, the design-specific cell library and various other necessary views of design-specific cells, constraints, and other user-specified data, supporting data (e.g., decision diagrams), objective analysis results, etc. It should be appreciated that database 80 can be updated as needed, and need not be located in one location.

In an aspect of the present invention, a user interface 75, either a text-based interface (e.g., an Unix shell), or a graphical interface (GUI), or a combination of the two, is provided for allowing the importing of the design and the user-specified constraints, etc. Interface 75 provides for the presentation of the design-specific cell information, netlist information concerning both standard cells and design-specific cells, the generation of various reports and scripts, the generation driver scripts to interface to other software tools, etc. As shown, user interface 75 takes in as inputs elements 85 and provides as outputs, elements 90. It should be appreciated that user interface 75 can be modified, as needed, to accommodate various design processes.

It should be understood that the foregoing description is only illustrative of the invention. Many alternatives and modifications can be devised by those skilled in the art of integrated circuit design, without departing from the invention. For example, the methods of the present invention can be implemented by an automated computer system programmed to control the execution of these teachings. Accordingly, the present invention is intended to embrace all such alternatives, modifications and variances that fall within the scope of the appended claims.

What is claimed is:

1. An automated method for designing integrated circuits, comprising the steps of:
   describing an integrated circuit (IC) design, the description including at least one design objective of said IC design;
   partitioning said description into at least one functional block, said functional block comprising at least one predefined cell; and
   dynamically generating at least one design-specific cell representative of said at least one predefined cell of said functional block, wherein said design-specific cell is generated, characterized and optimized at the transistor netlist level based on said design objective of said IC design.

2. The method of claim 1, wherein said step of generating comprises evaluating said design-specific cell based on cell usage context.

3. The method of claim 1, wherein said step of generating comprises characterizing and selecting said design-specific cell from a minimal set comprising at least one cell, based on said IC design objective.

4. The method of claim 3, wherein said step of characterizing and selecting is repeated until the design objective is met.

5. The method of claim 1, wherein said design objective is selected from the group consisting of: IC design die size, die area, performance, power consumption, routability, fault tolerance, signal integrity, testability, reliability and cost.

6. The method of claim 1, further comprising a step of optimizing said IC design.

7. The method of claim 6, wherein a design metric for said step of optimizing is at least one selected from the group consisting of: clock speed, transistor sizing, number of transistors, power consumption, fault tolerance, signal integrity characteristics, and noise characteristics.

8. The method of claim 7, wherein said optimizing is repeated until said IC design meets at least one design metric.

9. The method of claim 6, wherein said step of optimizing is performed automatically.

10. The method of claim 1, wherein said design-specific cell is at least one selected from the group consisting of: CMOS cells, static CMOS cells, and dynamic CMOS cells.

11. The method of claim 1, wherein said design-specific cell is optimized at the transistor netlist level for at least one selected from the group consisting of: performance, area, power consumption, testability and fault tolerance.

12. A system for implementing an automated integrated circuit design process, said system comprising:
   a description of an integrated circuit (IC) design, said description including at least one design objective of said IC design;
   a local optimization control for partitioning said description into at least one functional block, said functional block comprising at least one predefined cell; and
   a dynamic design-specific cell generator for generating at least one design-specific cell representation of said at least one predefined cell of said functional block, wherein said design-specific cell is generated, characterized and optimized at the transistor netlist level based on said design objective of said IC design.

13. The system of claim 12, further comprising an analysis control module for evaluating said design-specific cell based on cell usage context.

14. The system of claim 12, further comprising a control module for characterizing and selecting said design-specific cell from a minimal set comprising at least one cell, based on said IC design objective.

15. The system of claim 14, wherein said characterizing and selecting is repeated until said design objective is satisfied.

16. The system of claim 12, wherein said design-specific cell generator selects said design objective from a group consisting of: IC design die size, die area, performance, power consumption, routability, fault tolerance, signal integrity, testability, reliability, and cost.

17. The system of claim 12, further comprising an optimizer for optimizing said IC design.

18. The system of claim 17, wherein a design metric criteria used by said optimizer is at least one selected from the group consisting of: clock speed, transistor sizing, number of transistors, power consumption, fault tolerance, signal integrity characteristics, and noise characteristics.

19. The system of claim 18, wherein said optimizer is iteratively operated until said IC design meets at least one design.

20. The system of claim 17, wherein said optimizer is perated automatically.

21. The system of claim 11, wherein said design-specific cell is at least one selected from the group consisting of: CMOS cells, static CMOS cells, and dynamic CMOS cells.

22. A design-specific cell produced by an automated integrated circuit design process, said integrated circuit design process comprising:
   describing an integrated circuit (IC) design, the description including at least one design objective of said IC design;
   partitioning said description into at least one functional block, said functional block comprising at least one predefined cell; and
   dynamically generating at least one design-specific cell representative of said at least one predefined cell of said functional block, wherein said design-specific cell generator generates, characterizes and optimizes a transistor netlist level design-specific cell based on the design objective of said IC design.

23. The design-specific cell produced by said IC design process of claim 22, wherein said IC design process further comprises evaluating said design-specific cell based on cell usage context.

24. The design-specific cell produced by said IC design process of claim 22, wherein said IC design process characterizes and selects said design-specific cell from a minimal set comprising at least one design-specific cell, based on said IC design objective.

25. The design-specific cell produced by said IC design process of claim 24, wherein said IC design process is repeated until said design objective is met.

26. The design-specific cell produced by said IC design process of claim 22, wherein said design objective of said IC design process is selected from the group consisting of: IC design die size, die area, performance, power consumption, signal integrity, routability, fault tolerance, testability, reliability, and cost.

27. The design-specific cell produced by said IC design process of claim 22, wherein said IC design process further comprises a step of optimizing said IC design.

28. The design-specific cell produced by said IC design process of claim 27, wherein a design metric for said step of optimizing is at least one selected from the group consisting of: clock speed, transistor sizing, number of transistors, power consumption, fault tolerance, signal integrity characteristics, and noise characteristics.

29. The design-specific cell produced by said IC design process of claim 28, wherein said step of optimizing is repeated until said IC design satisfies at least one design metric.

30. The design-specific cell produced by said IC design process of claim 22, wherein said step of optimizing is performed automatically.

31. The design-specific cell of claim 22, wherein said design-specific cell is at least one selected from the group consisting of: CMOS cells, static CMOS cells, and dynamic CMOS cells.

32. A computer readable storage medium comprising executable computer readable program instructions which when executed cause a processing system to perform a method comprising:
   program instructions for describing an integrated circuit (IC) design, the description including at least one design objective of said IC design;
   program instructions for partitioning said description into at least one functional block, said functional block comprising at least one predefined cell; and
   program instructions for dynamically generating at least one design-specific cell representative of said at least one predefined cell of said functional block, wherein said design-specific cell generator generates, characterizes and optimizes a transistor netlist level design-specific cell based on the design objective of said IC design.

33. The computer readable storage medium of claim 32, wherein said program instructions for generating comprises program instructions for evaluating said design-specific cell based on usage context.

34. The computer readable storage medium of claim 32, wherein said program instructions for generating comprises program instructions for characterizing and selecting said design-specific cell from a minimal set comprising at least one cell, based on said IC design objective.

35. The computer readable storage medium of claim 34, wherein said program instructions for characterizing and selecting is repeated until the design objective is met.

36. The computer readable storage medium of claim 32, wherein said design objective is selected from the group consisting of: IC design die size, die area, performance, power consumption, routability, fault tolerance, signal integrity, testability, reliability and cost.

37. The computer readable storage medium of claim 32, further comprising a step of optimizing said IC design.

38. The computer readable storage medium of claim 37, wherein a design metric for said step of optimizing is at least one selected from the group consisting of: clock speed, transistor sizing, number of transistors, power consumption, fault tolerance, signal integrity characteristics, and noise characteristics.

39. The computer readable storage medium of claim 38, wherein said step of optimizing is performed automatically.

40. The computer readable storage medium of claim 39, wherein said optimizing is repeated until said IC design meets at least one design metric.

41. The computer readable storage medium of claim 32, wherein the program instructions generate at least one design-specific cell selected from the group consisting of: CMOS cells, static CMOS cells, and dynamic CMOS cells.

42. An automated method for designing integrated circuits, comprising the steps of:
   describing an integrated circuit (IC) design, the description including at least one design objective of said IC design;
   partitioning said description into at least one functional block, said functional block comprising at least one predefined cell;
   dynamically generating at least one design-specific cell representative of said at least one predefined cell of said functional block, wherein said design-specific cell is generated, characterized and optimized at the transistor netlist level based on said design objective of said IC design; and
   automatically optimizing said IC design, wherein said optimizing is repeated until said IC design meets at least one design metric, the design metric being used in said step of optimizing.

43. The method of claim 42, wherein said step of generating comprises evaluating said design-specific cell based on cell usage context.

44. The method of claim 42, wherein said step of generating comprises characterizing and selecting said design-specific cell from a minimal set comprising at least one cell, based on said IC design objective.

45. The method of claim 44, wherein said step of characterizing and selecting is repeated until the design objective is met.

46. The method of claim 42, wherein said design objective is selected from the group consisting of: IC design die size, die area, performance, power consumption, routability, fault tolerance, signal integrity, testability, reliability and cost.

47. The method of claim 42, wherein said design metric for said step of optimizing is at least one selected from the group consisting of: clock speed, transistor sizing, number of transistors, power consumption, fault tolerance, signal integrity characteristics, and noise characteristics.

48. The method of claim 42, wherein said design-specific cell is a transistor-level cell.

49. The method of claim 22, wherein said design-specific cell is at least one selected from the group consisting of: CMOS cells, static CMOS cells, and dynamic CMOS cells.

50. A system for implementing an automated integrated circuit design process, said system comprising:
   a description of an integrated circuit (IC) design, said description including at least one design objective of said IC design;
   a local optimization control for partitioning said description into at least one functional block, said functional block comprising at least one predefined cell;
   a dynamic design-specific cell generator for generating at least one design-specific cell representation of said at least one predefined cell of said functional block, wherein said design-specific cell is generated, characterized and optimized at the transistor netlist level based on said design objective of said IC design; and
   an optimizer for automatically optimizing said IC design, wherein said optimizing is repeated until said IC design meets at least one design metric, the design metric being used in said step of optimizing.

51. The system of claim 50, further comprising an analysis control module for evaluating said design-specific cell based on cell usage context.

52. The system of claim 50, further comprising a control module for characterizing and selecting said design-specific cell from a minimal set comprising at least one cell, based on said IC design objective.

53. The system of claim 52, wherein said characterizing and selecting is repeated until said design objective is satisfied.

54. The system of claim 50, wherein said design-specific cell generator selects said design objective from a group consisting of: IC design die size, die area, performance, power consumption, routability, fault tolerance, signal integrity, testability, reliability, and cost.

55. The system of claim 50, wherein design metric used by said optimizer is at least one selected from the group consisting of: clock speed, transistor sizing, number of transistors, power consumption, fault tolerance, signal integrity characteristics, and noise characteristics.

56. The system of claim 50, wherein said design-specific cell generator generates a transistor-level design-specific cell.

57. The system of claim 50, wherein said design-specific cell is at least one selected from the group consisting of: CMOS cells, static CMOS cells, and dynamic CMOS cells.

58. A design-specific cell produced by an automated integrated circuit design process, said integrated circuit design process comprising: describing an integrated circuit (IC) design, the description including at least one design objective of said IC design;
   partitioning said description into at least one functional block, said functional block comprising at least one predefined cell;
   dynamically generating at least one design-specific cell representative of said at least one predefined cell of said functional block, wherein said design-specific cell is generated, characterized and optimized at the transistor netlist level based on the design objective of said IC design; and
   automatically optimizing said IC design, wherein said optimizing is repeated until said IC design meets at least one design metric, the design metric being used in said step of optimizing.

59. The design-specific cell produced by said IC design process of claim 58, wherein said IC design process further comprises evaluating said design-specific cell based on cell usage context.

60. The design-specific cell produced by said IC design process of claim 58, wherein said IC design process characterizes and selects said design-specific cell from a minimal set comprising at least one design-specific cell, based on said IC design objective.

61. The design-specific cell produced by said IC design process of claim 60, wherein said IC design process is repeated until said design objective is met.

62. The design-specific cell produced by said IC design process of claim 58, wherein said design objective of said IC design process is selected from the group consisting of: IC design die size, die area, performance, power consumption, signal integrity, routability, fault tolerance, testability, reliability, and cost.

63. The design-specific cell produced by said IC design process of claim 58, wherein said design metric for said optimizing is at least one selected from the group consisting of: clock speed, transistor sizing, number of transistors, power consumption, fault tolerance, signal integrity characteristics, and noise characteristics.

64. The design-specific cell of claim 58, wherein said design-specific cell is at least one selected from the group consisting of: CMOS cells, static CMOS cells, and dynamic CMOS cells.

65. A computer readable storage medium comprising executable computer program instructions which when executed cause a processing system to perform a method comprising:
   program instructions for describing an integrated circuit (IC) design, the description including at least one design objective of said IC design;
   program instructions for partitioning said description into at least one functional block, said functional block comprising at least one predefined cell; and
   program instructions for dynamically generating at least one design-specific cell representative of said at least one predefined cell of said functional block, wherein said design-specific cell is generated, characterized and optimized at the transistor netlist level based on the design objective of said IC design; and
   program instructions for automatically optimizing said IC design, wherein said optimizing is repeated until said IC design meets at least one design metric, the design metric being used in said step of optimizing.

66. The computer readable storage medium of claim 65, wherein said program instructions for generating comprises program instructions for evaluating said design-specific cell based on cell usage context.

67. The computer readable storage medium of claim 65, wherein said program instructions for generating comprises program instructions for characterizing and selecting said design-specific cell from a minimal set comprising at least one cell, based on said IC design objective.

68. The computer readable storage medium of claim 67, wherein said program instructions for characterizing and selecting is repeated until the design objective is met.

69. The computer readable storage medium of claim 65, wherein said design objective is selected from the group consisting of: IC design die size, die area, performance, power consumption, routability, fault tolerance, signal integrity, testability, reliability and cost.

70. The computer readable storage medium of claim 65, wherein design metric for said step of optimizing is at least one selected from the group consisting of: clock speed, transistor sizing, number of transistors, power consumption, fault tolerance, signal integrity characteristics, and noise characteristics.

71. The computer readable storage medium of claim 65, wherein said design-specific cell is a transistor-level cell.

72. The computer readable storage medium of claim 32, wherein said design-specific cell is at least one selected from the group consisting of: CMOS cells, static CMOS cells, and dynamic CMOS cells.

* * * * *